(12) United States Patent
Kwon et al.

(10) Patent No.: US 6,815,275 B2
(45) Date of Patent: Nov. 9, 2004

(54) METHODS FOR FABRICATING METAL SILICIDE STRUCTURES USING AN ETCH STOPPING CAPPING LAYER

(75) Inventors: Hyung-shin Kwon, Kyungki-do (KR); Won-suek Cho, Kyungki-do (KR); Byung-jun Hwang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 34 days.

(21) Appl. No.: 10/256,719

(22) Filed: Sep. 27, 2002

(65) Prior Publication Data

US 2003/0092228 A1 May 15, 2003

(30) Foreign Application Priority Data

Nov. 10, 2001 (KR) ............................................ 2001-69981

(51) Int. Cl.[7] .................. H01L 21/336; H01L 21/8234
(52) U.S. Cl. ........................ 438/197; 438/664; 438/682
(58) Field of Search ................................ 438/197, 630, 438/649, 651, 663, 664, 682

(56) References Cited

U.S. PATENT DOCUMENTS 6,071,784 A * 6/2000 Mehta et al. ................ 438/303
6,284,635 B1 * 9/2001 Jang ............................ 438/592

* cited by examiner

Primary Examiner—Phuc T. Dang
(74) Attorney, Agent, or Firm—Myers Bigel Sibley & Sajovec

(57) ABSTRACT

A method of fabricating an integrated circuit device comprises forming a refractory metal layer on a silicon-containing substrate, processing the refractory metal layer to form an amorphous metal silicide layer, and depositing an insulating material on the amorphous metal silicide layer. The insulating material is deposited at a temperature that maintains at least a portion of the amorphous metal silicide layer in an amorphous state, to form a capping structure that contains the amorphous metal silicide layer. The method further includes crystallizing the contained amorphous metal silicide layer, and forming an etching stop layer on the capping structure.

37 Claims, 9 Drawing Sheets

METHODS FOR FABRICATING METAL SILICIDE STRUCTURES USING AN ETCH STOPPING CAPPING LAYER

RELATED APPLICATION

This application claims priority to Korean Patent Application No. 2001-69981, filed on Nov. 10, 2001, the contents of which are herein incorporated by reference in their entirety.

BACKGROUND OF THE INVENTION

The present invention relates to methods for fabricating integrated circuit devices, and more particularly, to methods for fabricating metal silicide structures in integrated circuit devices.

In general, a silicide layer is formed on a gate electrode and junction region of a metal oxide silicon (MOS) transistor to improve the conductive characteristics of the gate electrode and the junction region to reduce RC delay time. Such a silicide layer may be formed of a compound of a silicon material and a refractory metal layer made of cobalt, titanium, or tungsten by a selective deposition method.

A conventional method of fabricating a silicide layer by the selective deposition method will now be described with reference to FIGS. 1A through 1E. Referring to FIG. 1A, gate insulating layers 14 and gate electrodes 16 are formed on a semiconductor substrate 10 having an isolation layer 12. Insulating layer spacers 18 are formed at the sidewalls of the gate electrodes 16 by a conventional technique. Next, junction regions 20 are formed in the semiconductor substrate 10 between the gate electrodes 16. These junction regions 20 function as lightly doped drain (LDD) regions in a MOS transistor. A cobalt (Co) layer 22 is then deposited to a predetermined thickness on the semiconductor substrate 10.

As shown in FIG. 1B, the semiconductor substrate 10 is rapidly thermal-processed (hereinafter, "RTP") at low temperature, e.g., 450–470° C. The cobalt layer 22 reacts with the gate electrodes 16 and the junction regions 20 below the cobalt layer 22 to form an amorphous cobalt silicide layer (CoxSiy) 24. Thereafter, a portion of the cobalt layer 22 that does not react with the gate electrodes 16 and the junction regions 20 is removed.

As shown in FIG. 1C, a capping layer 26 is formed on the amorphous cobalt silicide layer 24 prior to performing a second RTP on the semiconductor substrate at high temperature. The capping layer 26 prevents the amorphous cobalt silicide layer 24 from being scattered and encroaching adjacent regions of the gate electrodes 16 and the junction regions 20 during the second RTP, when the amorphous cobalt silicide layer 24 is crystallized. Preferably, the capping layer is formed of a material that has stable characteristics at high temperature so as to prevent movement of the amorphous cobalt silicide 24, and can be used as an etch stopper during a subsequent process of forming contact holes.

Typically, a silicon oxynitride layer (SiON) is used as the capping layer 26 because it has stable characteristics at high temperature and excellent etching selectivity with respect to a silicon oxide interlevel insulating layer. In addition, the silicon oxynitride layer 26 can be formed by plasma-enhanced chemical vapor deposition (PECVD), which is performed at 350–450° C., so as to minimize temperature-related effects on the amorphous cobalt silicide layer 24 positioned below the silicon oxynitride layer 26. Also, the silicon oxynitride layer 26 can be formed to about 400–600 Å thickness.

Referring to FIG. 1D, the second RTP is performed on the semiconductor substrate 10, including the silicon oxynitride capping layer 26, at high temperature, e.g., 830–880° C. As a result, the phase of the amorphous cobalt silicide layer 24 is changed into a crystalline cobalt silicide layer (CoSi2) 28 having low resistance.

As shown in FIG. 1E, an interlevel insulating layer 30 is formed on the capping layer 26. A predetermined portion of the interlevel insulating layer 30 is etched to expose predetermined portions of the gate electrodes 16 and the junction regions 20. The exposed capping layer 26 is selectively etched to form contact holes H.

The above conventional method of fabricating integrated circuit devices may have some problems. For instance, the silicon oxynitride capping layer 26 is typically deposited at low temperature in order to minimize temperature-related effects on the amorphous cobalt silicide layer. However, since such a silicon oxynitride layer may have poor step coverage, it may be very difficult to deposit evenly on a semiconductor substrate having a high aspect ratio. This is especially true when the silicon oxynitride layer is formed on a surface having an extreme step, as the silicon oxynitride layer may be rent in the extreme step region.

In the event that the silicon oxynitride layer is not properly deposited, it may not function as an etch stopper when the contact holes H are formed, as shown in FIG. 2. Also, portions of the junction regions 20, as well as the cobalt silicide layer 28, may be hollowed out, which is called 'pitting'. When the pitting occurs at the junction regions 20, junction leakage may occur, thus deteriorating the integrated circuit device. Here, "P" denotes a region in which the pitting occurs.

The capping layer 26 can be formed of a silicon oxynitride layer made by low-pressure chemical vapor deposition (LPCVD), which can have excellent step coverage. However, during the LPCVD, the silicon oxynitride layer is typically formed at high temperature, e.g., above 650° C., which would change the characteristics of the amorphous cobalt silicide layer. For this reason, it may be difficult to control the resistance in the cobalt silicide layer.

SUMMARY OF THE INVENTION

According to embodiments of the present invention, a method of fabricating an integrated circuit device comprises forming a refractory metal layer on a silicon-containing substrate, processing the refractory metal layer to form an amorphous metal silicide layer, and depositing an insulating material on the amorphous metal silicide layer. The insulating material is deposited at a temperature that maintains at least a portion of the amorphous metal silicide layer in an amorphous state, to form a capping structure that contains the amorphous metal silicide layer. The method further includes crystallizing the contained amorphous metal silicide layer, and forming an etching stop layer on the capping structure.

In some embodiments of the present invention, the refractory metal layer may comprise cobalt, nickel, titanium, tungsten, and/or tantalum. Depositing of the insulating material may be preceded by removing a portion of the refractory metal layer.

In further embodiments of the present invention, the refractory metal layer may be thermally processed. The amorphous metal silicide layer may be crystallized using thermal processing.

According to some aspects of the invention, the refractory metal layer comprises cobalt. The cobalt-containing refractory metal layer may be thermally processed at 450–470° C. for 25–35 seconds. The amorphous metal silicide layer may be crystallized by thermal processing at 830–880° C. for 40–50 seconds.

In further embodiments of the present invention, depositing of the insulating material comprises plasma-enhanced chemical deposition of the insulating material. Also, the insulating material may comprise at least one of silicon oxynitride, silicon nitride, and silicon dioxide. The insulating material may be deposited to a thickness of about 50 to about 400 Å.

In still further embodiments of the present invention, forming an etching stop layer comprises forming an etching stop layer by low-pressure chemical vapor deposition or by atomic layer deposition. The etching stop layer may comprise at least one of silicon nitride and silicon oxynitride. The etching stop layer may be formed to a thickness of about 150 to about 250 Å.

BRIEF DESCRIPTION OF THE DRAWINGS

The present invention will become more apparent by describing in detail preferred embodiments thereof with reference to the attached drawings in which.

DETAILED DESCRIPTION OF THE INVENTION

Figure 1A:
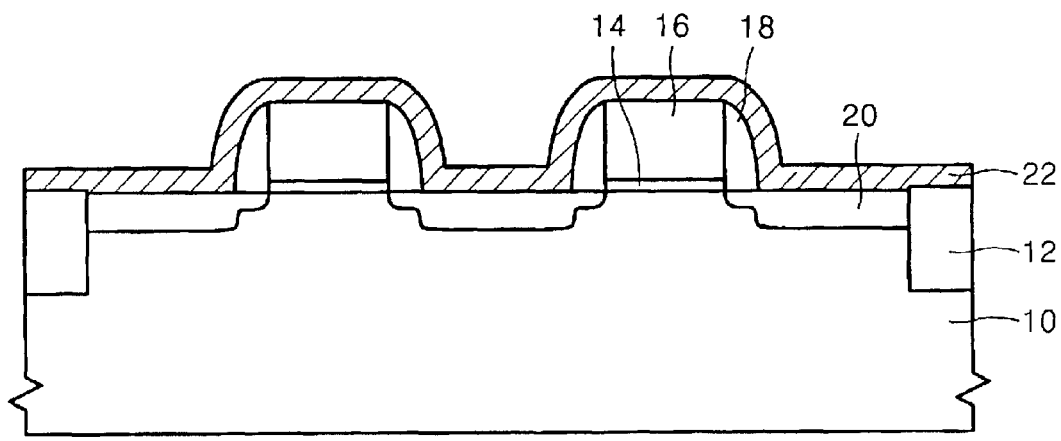
FIGS. 1A through 1E are cross-sectional views illustrating a conventional method of fabricating an integrated circuit device.
Figure 1B:
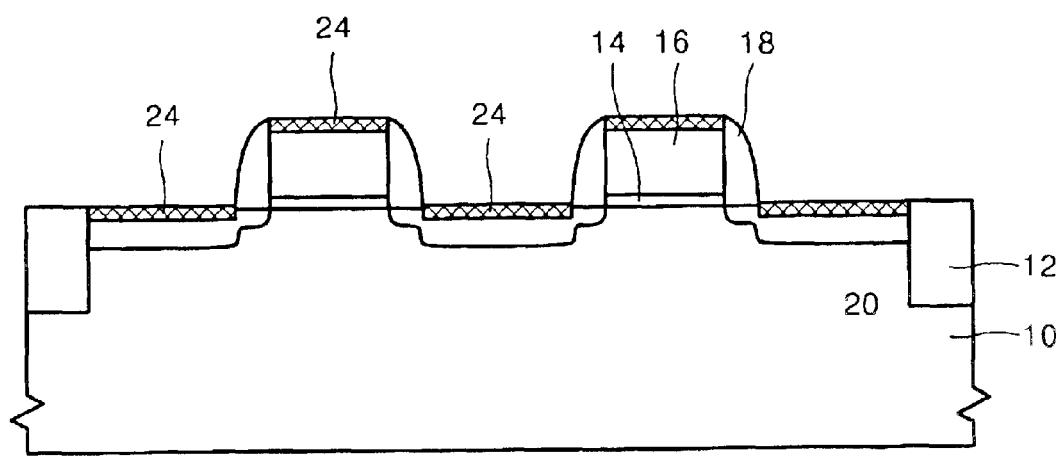
Figure 1C:
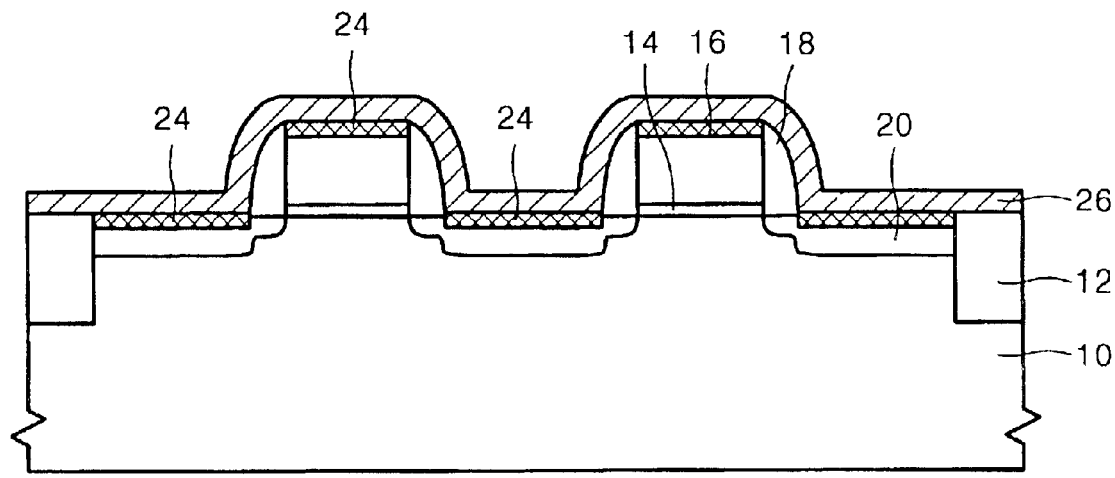
Figure 1D:
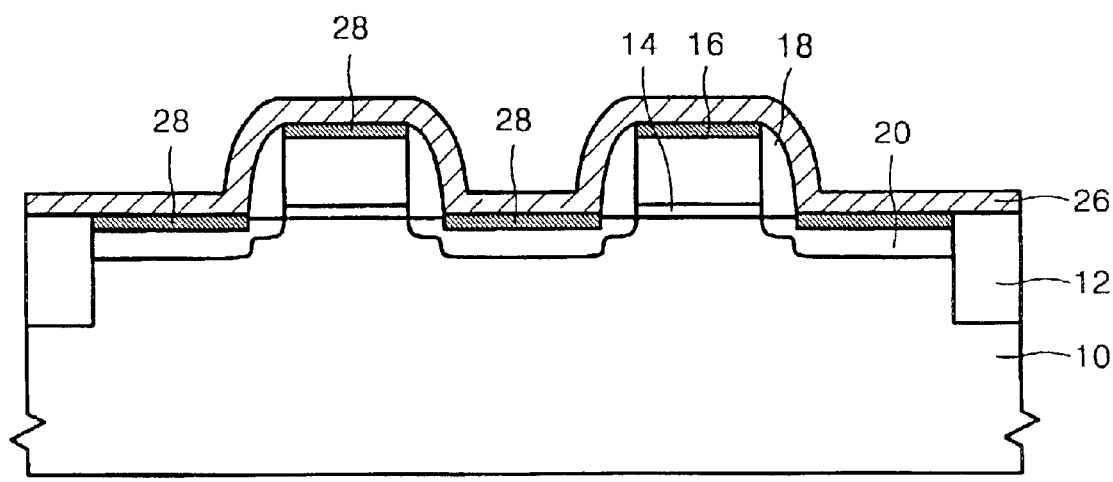
Figure 1E:
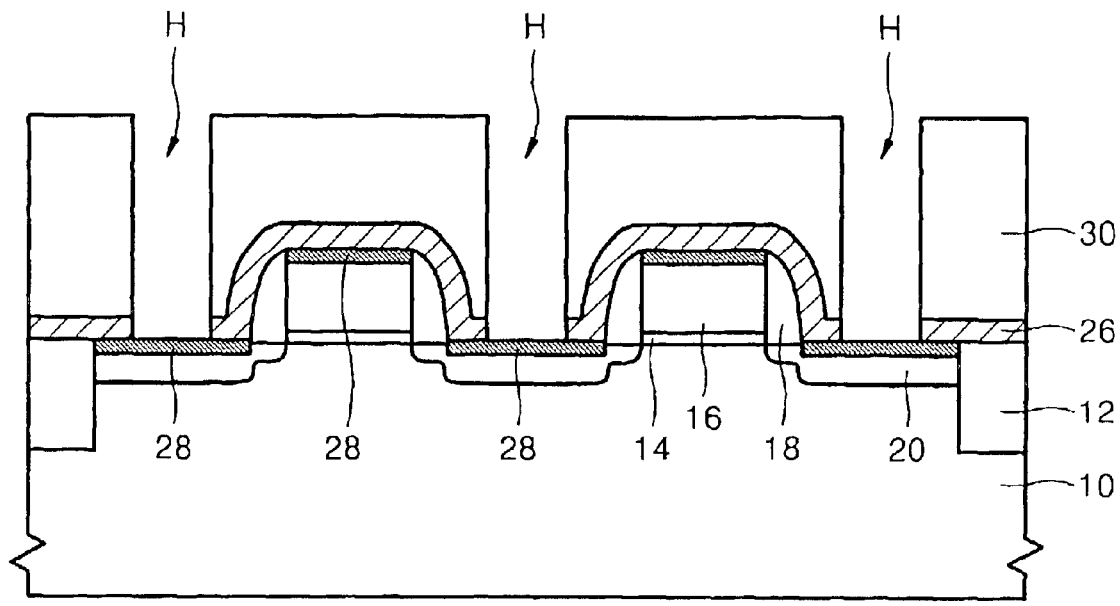
Figure 2:
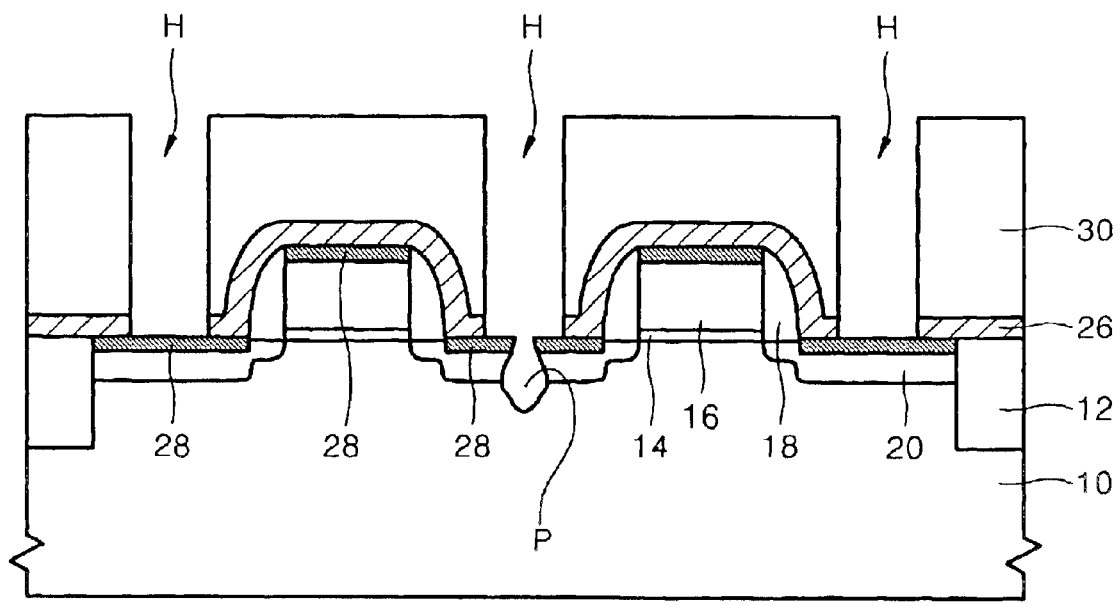
FIG. 2 is a cross-sectional view of a conventional integrated circuit device.

The present invention now will be described more fully with reference to the accompanying drawings, in which embodiments of the invention are shown. These embodiments are provided so that this disclosure will be thorough and complete. In the drawings, the thickness of layers and regions are exaggerated for clarity. It should also be understood that when a layer is referred to as being "on" another layer or substrate, it may be directly on the other layer or substrate, or intervening layers may also be present. The same reference numerals in different drawings represent the same elements, and thus their description will be omitted.

Figure 3A:
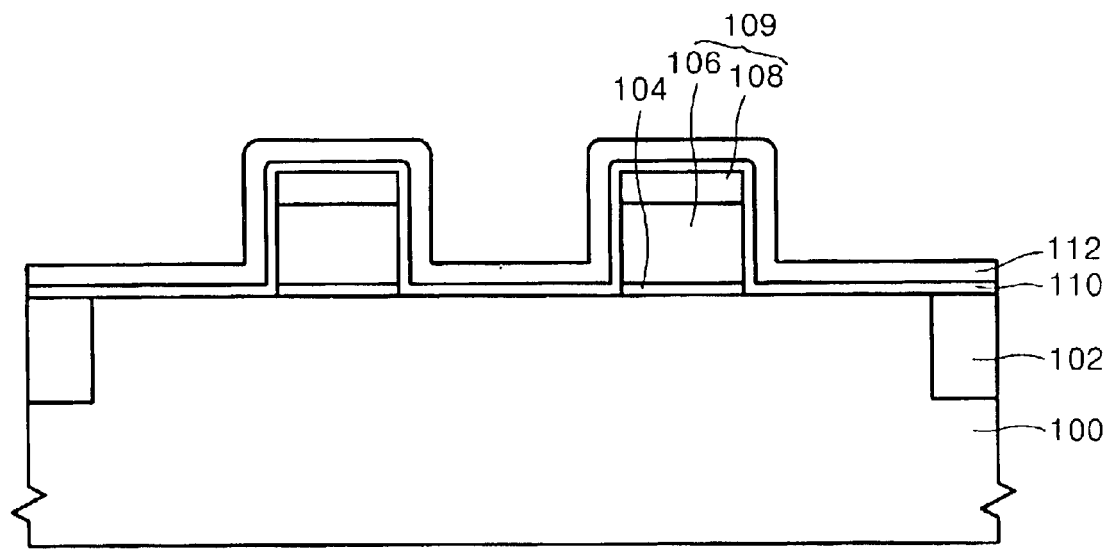
FIGS. 3A through 3G are cross-sectional views of intermediate fabrication products illustrating operations for fabricating an integrated circuit device according to some embodiments of the present invention.

Referring to FIG. 3A, an isolation layer 102 is formed in a semiconductor substrate 100 using, for example, a conventional technique. A gate insulating layer 104, a doped poly-silicon layer 106, and an anti-reflective layer 108 are sequentially deposited on the semiconductor substrate 100. Here, the anti-relective layer 108 may comprise silicon oxynitride. Portions of the anti-relective layer 108, the doped poly-silicon layer 106, and the gate insulating layer 104 are patterned, thus defining a gate electrode 109. A middle-temperature oxide layer 110 and an insulating layer 112 are sequentially deposited on the gate electrode 109. The insulating layer 112 may comprise silicon oxynitride. The middle-temperature oxide layer 110 can improve the adhesive characteristics between the doped poly-silicon layer 106 and the insulating layer 112. Low-concentration impurities, whose conductivity type is opposite to the impurity type of the semiconductor substrate 100, are ion-implanted into both sides of the gate electrode 109, between the steps of forming the gate electrode 109 and forming the middle-temperature oxide layer 110.

Figure 3B:
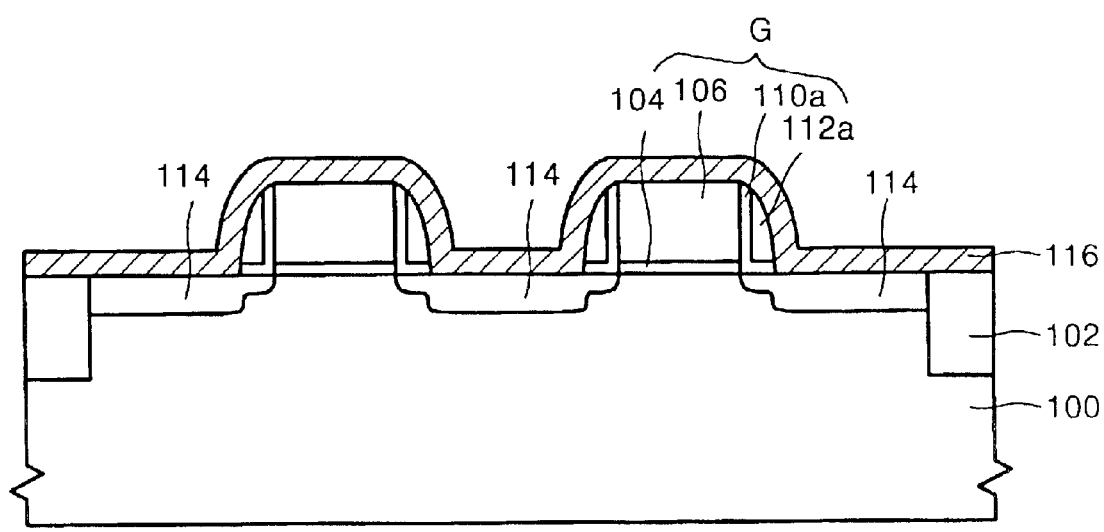

As shown in FIG. 3B, the insulating layer 112 and the middle-temperature oxide layer 110 are anisotropic-blanket etched to form gate spacers 110a and 112a along both sidewalls of the gate electrode 109 and the gate insulating layers 104, thus forming gate electrode structures G. During the anisotropic blanket etching, the anti-reflective layer 108 is removed because it has similar etching selectivity to the insulating layer 112. High-concentration impurities are ion-implanted into the semiconductor substrate 100 of both sides of the gate electrode structures G, thus forming junction regions 114 of a lightly-doped drain (LDD) type. As a result, MOS transistors are formed on the semiconductor substrate 100. The surface of the semiconductor substrate 100 is cleansed or radio-frequency (RF) sputtered to remove native oxide or etching remnant remaining on the semiconductor substrate 100. A refractory metal layer, such as a cobalt layer (Co) 116, is deposited to a predetermined thickness on the semiconductor substrate 100. The refractory metal layer may alternatively comprise nickel (Ni), titanium (Ti), tungsten (W), tantalum (Ta), or the like.

Figure 3C:
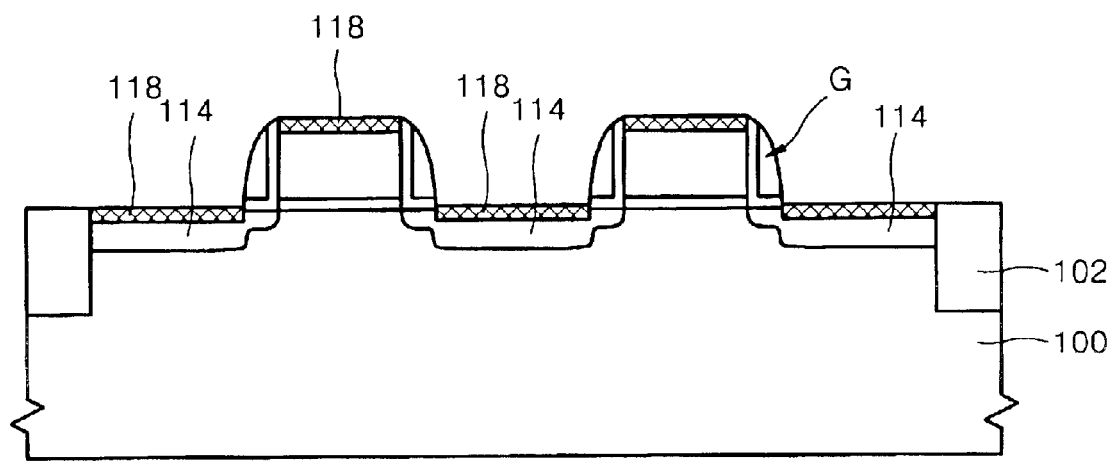

As shown in FIG. 3C, the semiconductor substrate 100 on which the Co layer 116 is deposited is rapidly thermal-processed (RTP) at 450–470° C., preferably, at 460° C., for about 25–35 seconds. As a result, the Co layer 116 reacts with the gate electrode structures G (doped poly silicon 106) and the junction regions 114, thus forming an amorphous cobalt silicide layer ($Co_xSi_y$) 118 on the gate electrode structures G and the junction regions 114. Portions of the Co layer 116 formed on the gate spacers 110a and 112a and the isolation layer 102 may be removed by conventional techniques.

Cobalt silicide is typically formed by high-temperature thermal processing in order to have a low resistance. However, because the Co layer 116 reacts quickly at high temperature, it is difficult to control the thickness of the cobalt silicide layer. Therefore, to control the thickness of the cobalt silicide layer, an amorphous cobalt silicide layer 118 is formed at low temperature, and is then thermal-processed at high temperature to form a crystalline cobalt silicide layer.

Figure 3D:
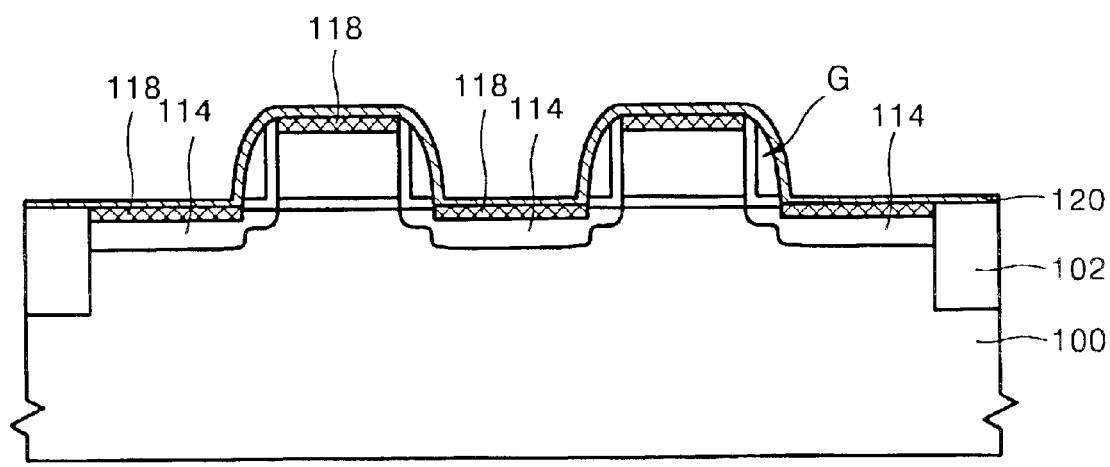

As shown in FIG. 3D, a capping layer 120 is formed on the amorphous cobalt silicide layer 118 on the semiconductor substrate 100. The capping layer 120 may be a silicon oxynitride layer (SiON) deposited by plasma-enhanced chemical vapor deposition (PECVD), a silicon nitride layer (SiN) deposited by PECVD, or a silicon oxide layer (SiO2) deposited by PECVD. It may be advantageous to use PECVD to deposit the capping layer 120, because this process may be less likely to alter the characteristics of the amorphous cobalt silicide layer 118. Thus, it is possible to reduce any effects on the amorphous cobalt silicide layer 118 if the capping layer 120 is formed by PECVD, at a temperature of about 350–450° C. Further, if the capping layer 120 comprises a silicon oxynitride layer or a silicon nitride layer, it can function as an etch stopper. The capping layer 120 may be formed to a thickness of about 50–400 Å.

Figure 3E:
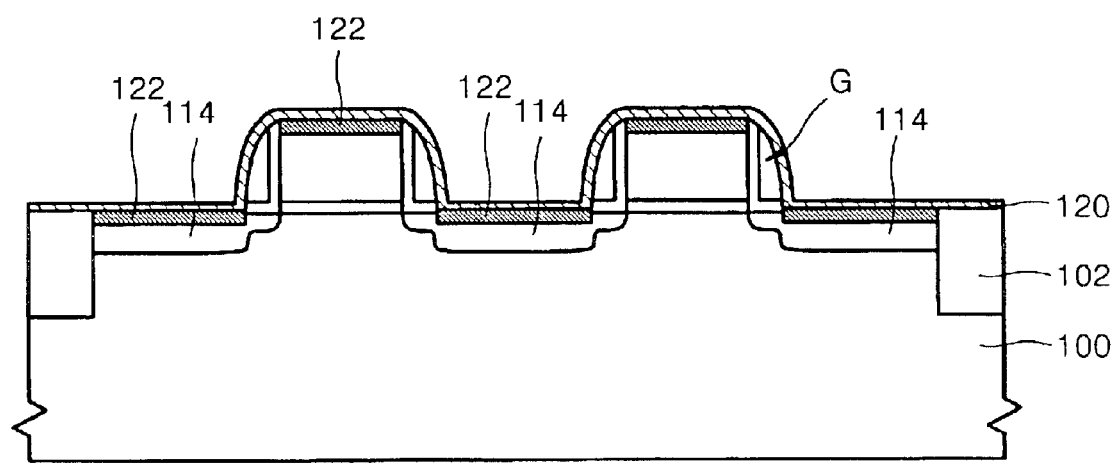

Referring to FIG. 3E, a second RTP is performed on the semiconductor substrate 100 at 830–880° C. for about 40–50 seconds. As a result, the amorphous cobalt silicide layer 118 is changed into a crystalline cobalt silicide layer (CoSi2) 122. At this time, the capping layer 120 formed by PECVD, e.g., a silicon oxynitride layer, shields the amorphous cobalt silicide layer 118, thus preventing the amorphous cobalt silicide layer 118 from being scattered to adjacent regions during the second high-temperature RTP process.

Figure 3F:
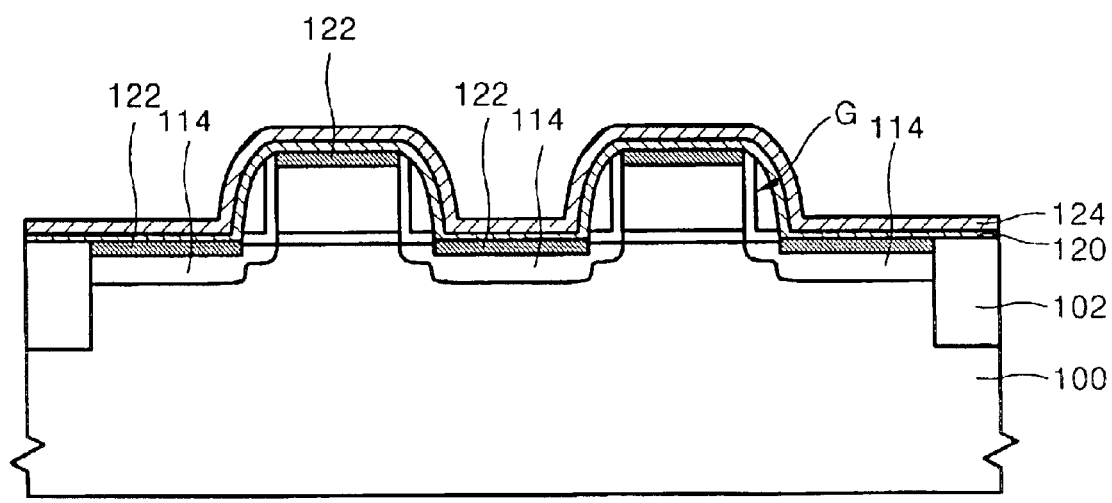

As shown in FIG. 3F, a buffer etch stopper 124 is deposited on the capping layer 120. The buffer etch stopper 124 can prevent pitting from occurring at a region where the capping layer 120 is not properly deposited. The buffer etch stopper 124 can be a silicon nitride layer (SiN) deposited by low pressure chemical vapor deposition (LPCVD), which has excellent step coverage, or a silicon oxynitride layer (SiON) deposited by LPCVD. Although a layer formed by LPCVD may have excellent step coverage, it typically is deposited at high temperature, e.g., 650–700° C. However, according to this embodiment of the present invention, the silicon nitride (or silicon oxynitride) buffer etch stopper 124 is formed after the cobalt silicide layer is crystallized, which can preserve the characteristics of the cobalt silicide layer. The buffer etch stopper 124 may be formed to a thickness of about 150–250 Å.

Figure 3G:
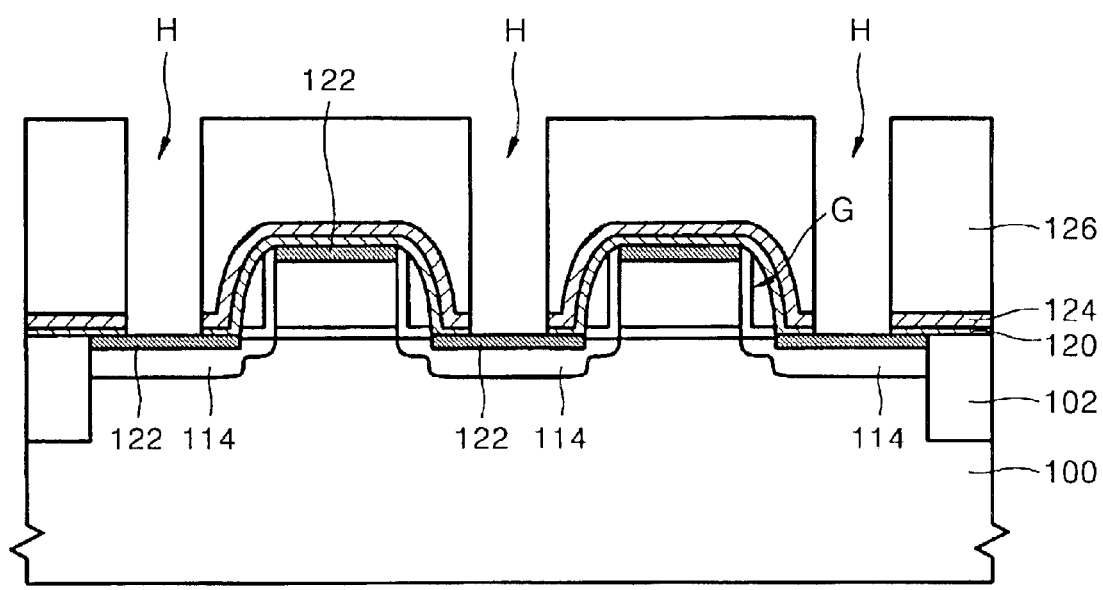

As shown in FIG. 3G, an interlevel insulating layer 126 is deposited on the buffer etch stopper 124. The interlevel insulating layer 126 may be a silicon oxide-based insulating layer, or other dielectric layer. In order to form contact holes that expose the gate electrode G or the junction regions 114, portions of the interlevel insulating layer 126 are etched to expose the buffer etch stopper 124. Then, the exposed buffer etch stopper 124 and capping layer 120 are etched to form contact holes H, using, for example, CF4, CHF3 or Ar gas. In the event that the capping layer 120 is a silicon nitride layer or silicon oxynitride layer, it is possible to remove the capping layer 120 together with the buffer etch stopper 124. When the interlevel insulating layer is etched, pitting may be reduced, because the buffer etch stopper 124 is evenly formed on the resultant structure of the semiconductor substrate 100 by LPCVD.

Figure 4:
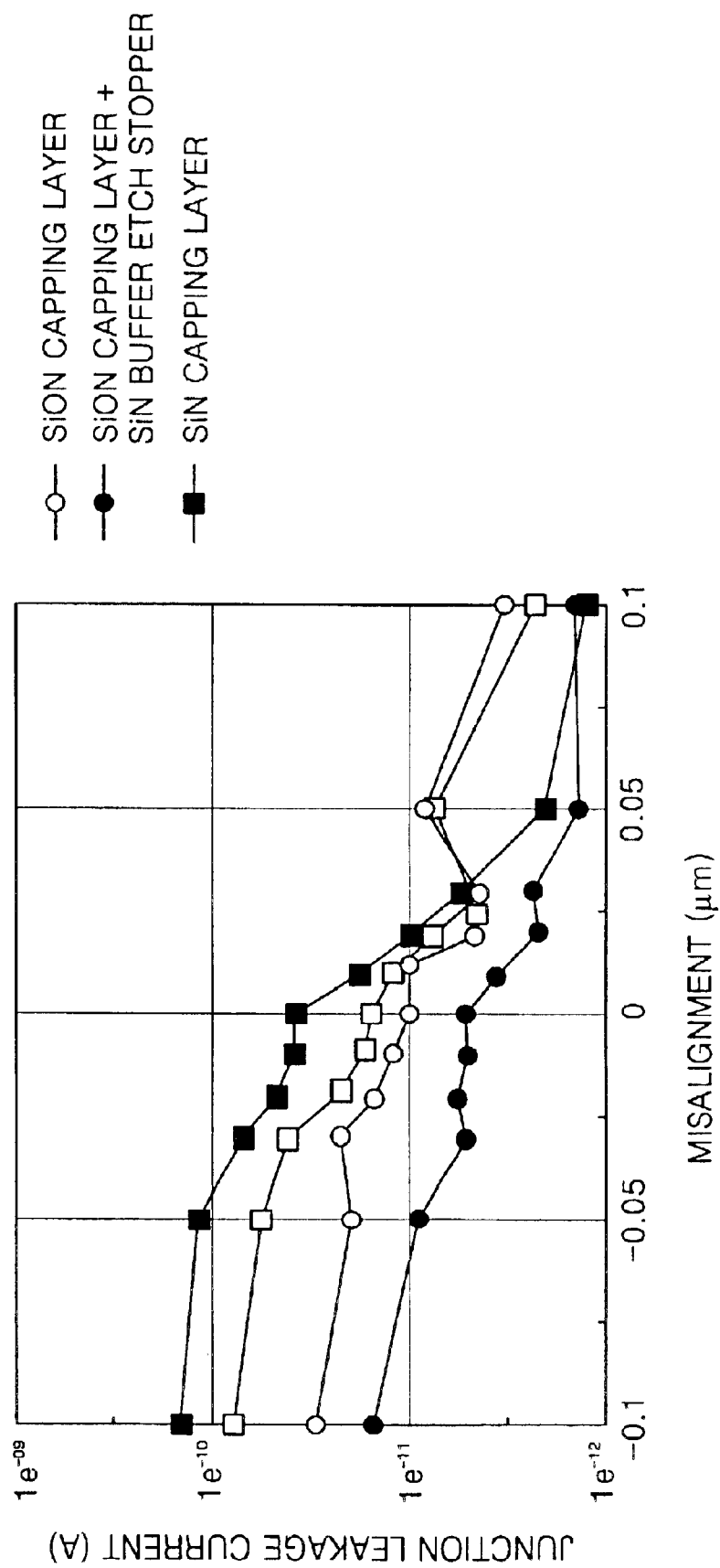
FIG. 4 is a graph showing the extent of junction leakage current occurring in an integrated circuit device having a buffer etch stopper according to some embodiments of the present invention.

FIG. 4 is a graph showing junction leakage currents in an integrated circuit device having a buffer etch stopper according to embodiments of the invention in comparison to an integrated circuit device without a buffer etch stopper. FIG. 4 illustrates that junction leakage current can be remarkably reduced in a capping layer comprising a silicon nitride buffer etch stopper formed by LPCVD on a silicon oxynitride layer formed by PECVD, compared to conventional capping layers consisting of a silicon oxynitride layer formed by PECVD or a silicon nitride layer formed by LPCVD.

Figure 5:
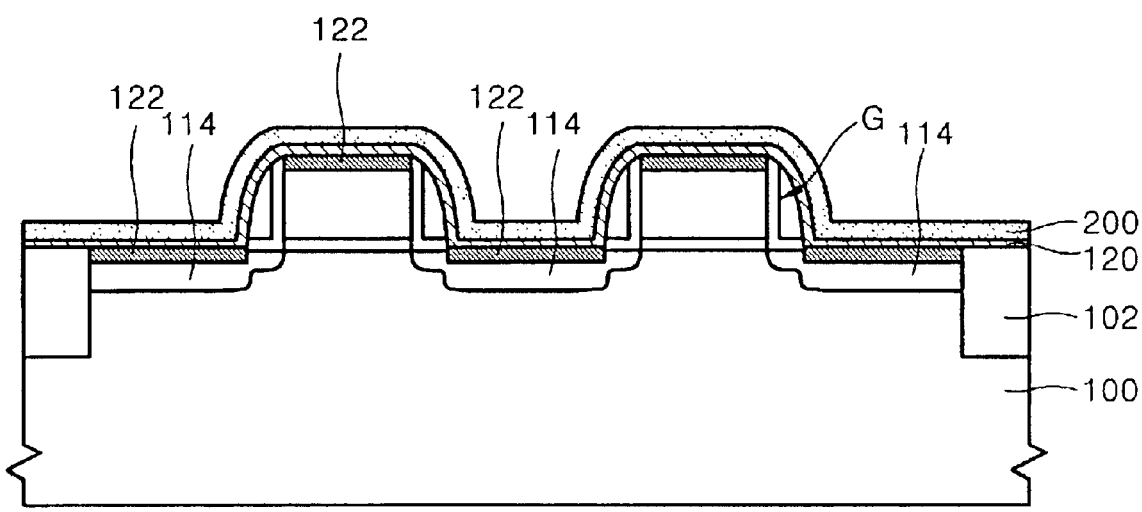
FIG. 5 is a cross-sectional view of an integrated circuit device according to further embodiments of the present invention.

FIG. 5 is a cross-sectional view of an integrated circuit device according to further embodiments of the present invention. According to these embodiments, a process the same as that described above can be used up to formation of the crystalline silicide layer 122. A silicon nitride (SiN) layer 200 maybe formed by atomic layer deposition (ALD) for use as a buffer etch stopper. Alternatively, the buffer etch stopper may be a silicon oxynitride (SiON) layer formed by ALD. In fact, many materials and methods for forming a buffer etch stopper may be selected. That is, a buffer etch stopper may be formed of any material having excellent step coverage and etching selectivity with respect to an interlevel insulating layer.

As previously mentioned, a silicon oxynitride layer is deposited by PECVD at low temperature as a capping layer, according to an embodiment of the present invention. Then, a crystalline silicide layer is formed. Thereafter, for excellent step coverage, a silicon nitride layer (or a silicon oxynitride layer) is deposited on the capping layer by LPCVD or ALD as a buffer etch stopper. As a result, it is possible to prevent the encroachment of an amorphous cobalt silicide layer when forming a crystalline cobalt silicide layer, and further, it is possible to form contact holes without pitting, thereby reducing the occurrence of junction leakage currents.

In the drawings and specification, there have been disclosed typical embodiments of the invention and, although specific terms are employed, they are used in a generic and descriptive sense only and not for purposes of limitation, the scope of the invention being set forth in the following claims. Although the invention has been described with reference to particular embodiments, it will be apparent to one of ordinary skill in the art that modifications of the described embodiments may be made without departing from the spirit and scope of the invention.

What is claimed is:

1. A method of fabricating an integrated circuit device, comprising:

forming a MOS transistor on a silicon-containing substrate;

depositing a refractory metal layer on the silicon-containing substrate;

forming an amorphous suicide layer on gate and source/drain portions of the MOS transistor by thermal processing the refractory metal layer;

removing a portion of the refractory metal layer to leave the amorphous silicide layer on the gate and source/drain portions of the MOS transistor;

forming a capping layer that contains the amorphous silicide layer;

forming a crystalline suicide layer by crystallizing the contained amorphous suicide layer; and forming a buffer etch stopper on the contained crystalline silicide layer.

2. The method of claim 1, wherein the refractory metal layer comprises at least one of cobalt (Co), nickel (Ni), titanium (Ta), tungsten (W) and tantalum (Ta).

3. The method of claim 1, wherein the amorphous silicide layer is formed by performing rapid thermal processing on the refractory metal layer at about 450–470° C. for 25–35 seconds.

4. The method of claim 1, wherein the capping layer is an insulating layer made by plasma-enhanced chemical vapor deposition (PEGVD).

5. The method of claim 4, wherein the capping layer comprises at least one of silicon oxynitride, silicon nitride and silicon dioxide.

6. The method of claim 4, wherein the capping layer is formed to a thickness of about 50 to about 400 Å.

7. The method of claim 1, wherein the crystalline suicide layer is formed by performing rapid thermal processing on the amorphous suicide layer at 830–880° C. for 40–50 seconds.

8. The method of claim 1, wherein the buffer etch stopper is an insulating layer formed by low pressure chemical vapor deposition (LPCVD).

9. The method of claim 8, wherein the buffer etch stopper comprises at least one of silicon nitride (SiN) and silicon oxynitride (SiON).

10. The method of claim 1, wherein the buffer etch stopper is an insulating layer made by atomic layer deposition (ALD).

11. The method of claim 10, wherein the buffer etch stopper comprises at least one of silicon nitride (SiN) and silicon oxynitride (SiON).

12. The method of claim 10, wherein the buffer etch stopper is formed to a thickness of about 150 to about 250 Å.

13. A method of fabricating an integrated circuit device, comprising:
forming a MOS transistor on a semiconductor substrate;
depositing a cobalt layer on the semiconductor substrate;
forming an amorphous cobalt silicide layer on the semiconductor substrate by performing a first thermal processing on the cobalt layer;
removing a portion of the cobalt layer;
forming an insulating layer by plasma-enhanced chemical vapor deposition (PECVD) of an insulating material on the amorphous suicide layer;
forming a crystalline cobalt suicide layer by performing a second thermal processing on the amorphous cobalt silicide layer; and
forming a buffer etch stopper on the crystalline cobalt suicide layer.

14. The method of claim 13, wherein the first thermal processing is performed at about 450–470° C. for 25–35 seconds.

15. The method of claim 13, wherein the insulating layer formed by PECVD is any one of a silicon oxynitride layer, a silicon nitride layer and a silicon oxide layer.

16. The method of claim 13, wherein the insulating layer formed by PECVD is formed to a thickness of about 50 to about 400 Å.

17. The method of claim 13, wherein the buffer etch stopper is formed by low pressure chemical vapor deposition (LPCVD).

18. The method of claim 17, wherein the buffer etch stopper comprises at least one of silicon nitride and silicon oxynitride.

19. The method of claim 13, wherein the buffer etch stopper is formed by atomic layer deposition (ALD).

20. The method of claim 19, wherein the buffer etch stopper comprises at least one of silicon nitride and silicon oxynitride.

21. The method of claim 13, wherein the buffer etch stopper is formed to a thickness of about 150 to about 250 Å.

22. The method of claim 13, wherein during the second thermal processing, the amorphous suicide layer is thermally processed at 830–880° C. for 40–50 seconds.

23. A method of fabricating an integrated circuit device, comprising:
forming a refractory metal layer on a silicon-containing substrate;
processing the refractory metal layer to form an amorphous metal silicide layer;
depositing an insulating material on the amorphous metal silicide layer at a temperature that maintains at least a portion of the amorphous metal silicide layer in an amorphous state to form a capping structure that contains the amorphous metal silicide layer;
crystallizing the contained amorphous metal silicide layer; and
forming an etching stop layer on the capping structure.

24. The method of claim 23 wherein depositing an insulating material is preceded by removing a portion of the refractory metal layer.

25. The method of claim 23, wherein processing the refractory metal layer comprises thermal processing the refractory metal layer.

26. The method of claim 23, wherein the refractory metal layer comprises cobalt and wherein processing the refractory metal layer comprises thermal processing at 450–470° C. for 25–35 seconds.

27. The method of claim 23, wherein crystallizing the contained amorphous metal silicide layer comprises thermal processing the amorphous metal silicide layer.

28. The method of claim 23, wherein the refractory metal layer comprises of cobalt and wherein crystallizing the contained amorphous metal silicide layer comprises thermal processing at 830–880° C. for 40–50 seconds.

29. The method of claim 23, wherein depositing an insulating material comprises plasma-enhanced chemical deposition (PECVD) of the insulating material.

30. The method of claim 29, wherein the insulating material comprises at least one of silicon oxynitride, silicon nitride, and silicon dioxide.

31. The method of claim 29, wherein depositing an insulating material comprises depositing the insulating material to a thickness of about 50 to about 400 Å.

32. The method of claim 23, wherein forming an etching stop layer comprises forming the etching stop layer by low-pressure chemical vapor deposition (LPCVD).

33. The method of claim 32, wherein the etching stop layer comprises at least one of silicon nitride (SiN) and silicon oxynitride (SiON).

34. The method of claim 32, wherein forming an etching stop layer comprises forming the etching stop layer to a thickness of about 150 to about 250 Å.

35. The method of claim 23, wherein forming an etching stop layer comprises forming the etching stop layer by atomic layer deposition (ALD).

36. The method of claim 35, wherein the etching stop layer comprises at least one of silicon nitride (SiN) and silicon oxynitride (SiON).

37. The method of claim 23, wherein the refractory metal layer comprises at least one of cobalt (Co), nickel (Ni), titanium (Ti), tungsten (W), and tantalum (Ta).

* * * * *